(12) United States Patent
Zukor et al.

(10) Patent No.: US 7,357,709 B2
(45) Date of Patent: Apr. 15, 2008

(54) METAL VENT

(75) Inventors: Kenneth S. Zukor, Havre de Grace, MD (US); James W. Mann, Elkton, MD (US)

(73) Assignee: Gore Enterprise Holdings, Newark, DE (US)

( * ) Notice: Subject to any disclaimer, the term of this patent is extended or adjusted under 35 U.S.C. 154(b) by 0 days.

(21) Appl. No.: 10/823,066

(22) Filed: Apr. 12, 2004

(65) Prior Publication Data

US 2005/0227610 A1 Oct. 13, 2005

(51) Int. Cl.
*F24F 7/00* (2006.01)
(52) U.S. Cl. .............................. 454/270; 454/274; 96/6
(58) Field of Classification Search ................ 454/270, 454/271, 274, 275, 276, 370, 254; 95/46; 96/6
See application file for complete search history.

(56) References Cited

U.S. PATENT DOCUMENTS

| | | | |
|---|---|---|---|
| 1,409,902 A | 3/1922 | Ausen | |
| 3,951,293 A | 4/1976 | Schulz | 215/261 |
| 3,953,566 A | 4/1976 | Gore | 264/288 |
| 3,962,153 A | 6/1976 | Gore | 260/2.5 R |
| 4,096,227 A | 6/1978 | Gore | 264/210 R |
| 4,136,796 A | 1/1979 | Dubois et al. | 220/256 |
| 4,187,390 A | 2/1980 | Gore | 174/102 R |
| 4,478,665 A | 10/1984 | Hubis | 156/229 |
| 4,512,243 A * | 4/1985 | Ballard et al. | 454/368 |
| 4,902,423 A | 2/1990 | Bacino | 210/500.36 |
| 5,125,428 A * | 6/1992 | Rauter | 137/199 |
| 5,126,054 A | 6/1992 | Matkovich | 210/641 |
| 5,215,312 A | 6/1993 | Knappe et al. | 277/1 |
| 5,353,949 A * | 10/1994 | Seibert et al. | 220/371 |
| 5,486,429 A | 1/1996 | Thibault | 429/27 |
| 5,506,067 A * | 4/1996 | Tinker | 429/27 |
| 5,522,769 A | 6/1996 | DiGuiseppi | 454/270 |
| 5,596,814 A | 1/1997 | Zingle et al. | 34/296 |
| 5,732,837 A | 3/1998 | Jones | 215/311 |
| 5,785,390 A * | 7/1998 | Gold et al. | 301/108.1 |
| 5,882,454 A | 3/1999 | Baginski et al. | 156/73.5 |
| 5,901,867 A | 5/1999 | Mattson | 215/261 |
| 5,928,516 A * | 7/1999 | Hopkins et al. | 210/636 |
| 5,988,426 A | 11/1999 | Stern | 220/371 |
| 6,170,684 B1 | 1/2001 | Vincent et al. | 215/261 |
| 6,325,463 B1 | 12/2001 | Sitter et al. | 301/124.1 |
| 6,364,924 B1 * | 4/2002 | Mashiko et al. | 55/385.4 |
| 6,464,425 B1 * | 10/2002 | Closkey | 404/26 |
| 6,523,724 B2 * | 2/2003 | Paulovich et al. | 222/189.09 |

FOREIGN PATENT DOCUMENTS

| | | |
|---|---|---|
| DE | 29514072 | 11/1995 |
| JP | 01269766 | 10/1989 |
| WO | WO 03/016726 A1 | 2/2003 |

* cited by examiner

*Primary Examiner*—Gregory Wilson
(74) *Attorney, Agent, or Firm*—Richard W. Ellis

(57) ABSTRACT

A metal vent having an aperture for the passage of a fluid, a porous membrane sealing the aperture, wherein the components of the vent are assembled by an interference fit.

35 Claims, 5 Drawing Sheets

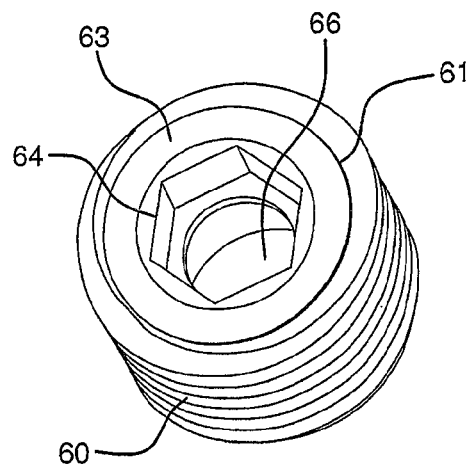
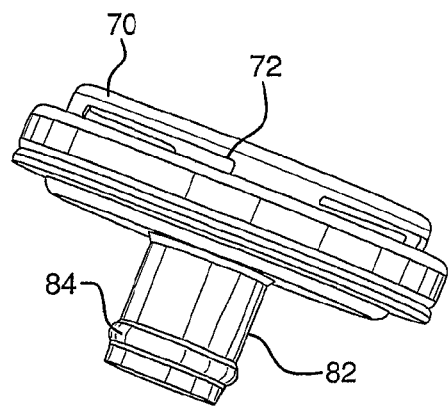
FIG. 4　　　　　　　FIG. 5
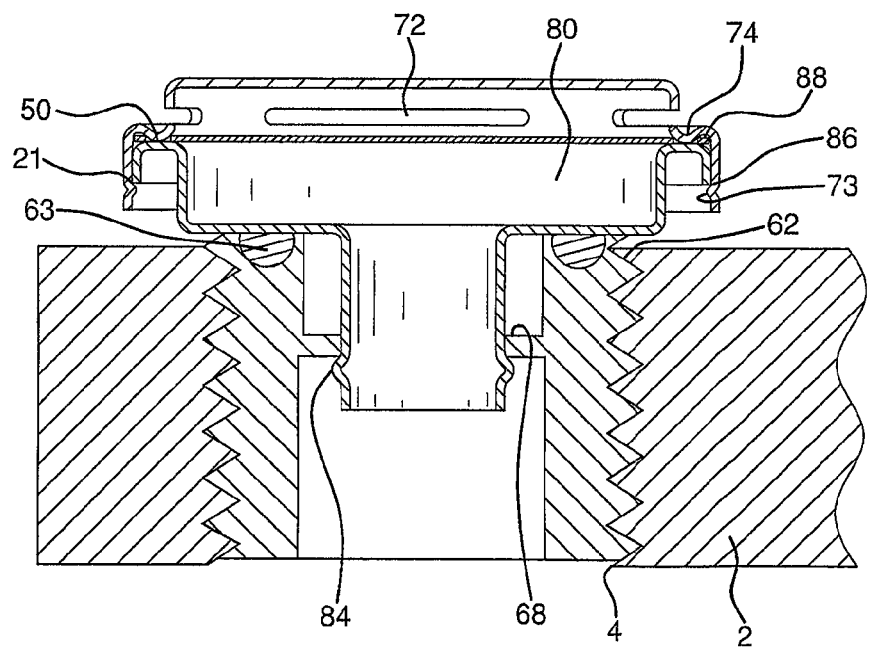
FIG. 6

METAL VENT

BACKGROUND

Vents find use in many applications. For example, in the automotive industry, electrical component housings, gear housings, brake housings and even vehicle bodies use vents to equalize pressure between the housing or body interior and the surrounding environment. In other applications, the function of the vent is not bulk flow for pressure equalization, but diffusion for the purpose of transporting select components across the media, such as the diffusion of water across a media for moisture control. In these types of applications the driving force is not pressure, but temperature, osmotic pressure, electrostatic attraction or repulsion, or some other driving force. Vents are also used in many other applications, such as electrical and mechanical equipment housings or chemical containers. Such housings, enclosures or containers are collectively referred to herein as a "housing."

In many applications, vents must not only be gas permeable to allow for pressure equalization, but also be liquid impermeable to seal the interior of a housing from moisture, liquids or contaminants, which can damage internal equipment or components and corrode the housing.

Press fitted vents containing a molded polymer or plastic body and a porous membrane formed from polytetrafluoroethylene (PTFE), polypropylene or polyethylene are known. Known polymer vents are used as air vent devices in, for example, a breather valve, a filter, a diaphragm device, etc. Press fitted vents typically include a membrane with circumferentially located holes that are positioned between rigid resin portions bound together through the circumferentially located holes. This rigid member is encompassed by a soft resin to form the press fitted article. Many other configurations of molded polymer or plastic vents are known, however, all suffer significant shortcomings.

Polymer and plastic vents lack durability as well as heat and chemical resistance. Accordingly, these vents cannot be used in certain applications where they may be subject to high temperatures, ultraviolet ("UV") or chemical degradation or impact.

Metal vents are known to provide improved durability in some applications. However, known metal vents rely on some form of sealant, adhesive or gasket to seal the membrane to the vent. These sealants and gaskets are also subject to degradation, and may not be useful at high temperatures.

Thus, a need exists for a durable, metal vent capable of withstanding adverse conditions including high temperatures and corrosive environments.

SUMMARY

In one aspect, the invention provides a vent consisting essentially of a metal body comprising an aperture for the passage of a fluid, a first membrane bearing surface surrounding the aperture and a second membrane bearing surface surrounding the aperture and a membrane having a first side in contact with the first membrane bearing surface and a second side in contact with the second membrane bearing surface, wherein an interfering relation between the membrane, the first membrane bearing surface and the second membrane bearing surface forms a seal surrounding the aperture.

In another aspect, the invention provides a vent consisting essentially of a metal body having an aperture for the passage of a fluid and a membrane bearing surface surrounding the aperture; a membrane covering the aperture and having a first side in contact with the first membrane bearing surface and a second side opposite the first side; a metal shell having a second membrane bearing surface, the second membrane bearing surface in contact with the second side of the membrane and the shell attached to the body by an interference fit to form a seal surrounding the aperture.

In a further aspect, the invention provides a device comprising: a housing; a port in the housing; and a vent disposed over the port, the vent consisting essentially of: a metal body having an aperture for passage of a gas; a membrane spanning the aperture; and a metal shell having a perforation therein for the passage of a gas, the shell attached to the body by an interference fit to form a seal between the membrane and the body, the seal surrounding the aperture.

In yet another aspect, the invention provides a method of making a vent, comprising the steps of: providing a metal housing including an aperture therethrough for the passage of a gas, covering the aperture with a membrane such that the membrane contacts the housing, attaching a cover having a perforation therein to the housing by an interference fit such that the cover contacts the membrane, whereby a seal is formed between the membrane and the housing.

DESCRIPTION OF THE DRAWINGS

FIGS. 4-6 show another embodiment of a vent in accordance with the present invention in which an insert is placed in a housing and the vent is pressed into the insert.

DETAILED DESCRIPTION

Figure 1:
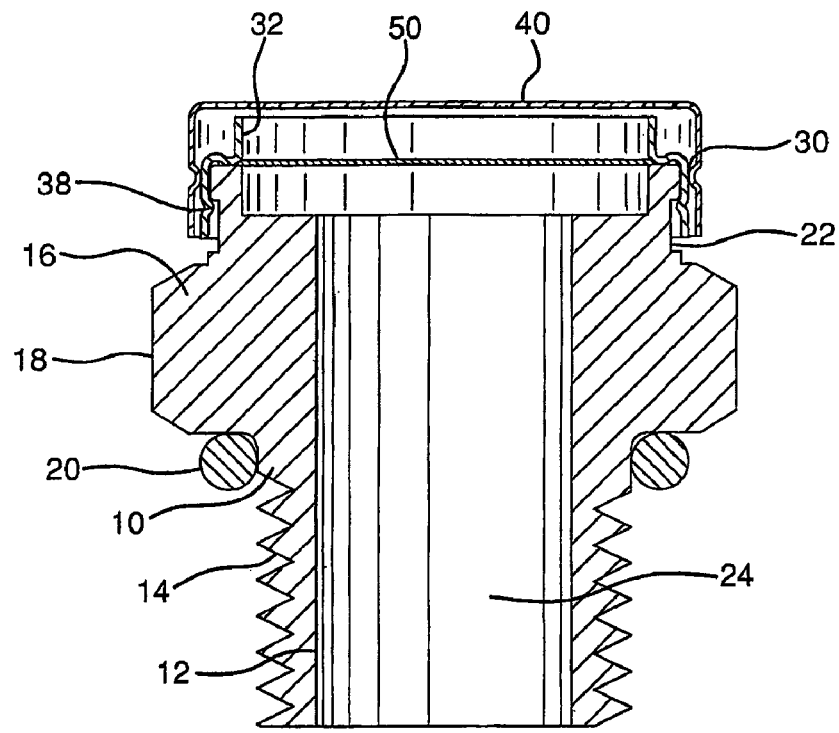
FIG. 1 is a cross sectional view of a vent in accordance with the present invention.

The vent according to one aspect of the present invention provides pressure equalization for a housing, such as an equipment enclosure for mechanical or electrical equipment, or a chemical enclosure. In one aspect, the vent comprises an all metal body with a metal shell or cap. The vent body includes an aperture providing fluid communication between the enclosure and the atmosphere. A vapor permeable, liquid impermeable membrane spans the aperture, allowing gaseous communication between the enclosure and the atmosphere, but preventing ingress of liquids or other contaminants. The metal shell may be adapted to protect the membrane and include perforations to provide fluid communication between the atmosphere and the membrane.

The shell and vent body are uniquely assembled using only an interference fit. The membrane is compressed between an upper membrane bearing surface on the shell and a lower membrane bearing surface on the vent body. Compression of the membrane seals the membrane over the aperture. This novel construction provides an extremely rugged and durable vent that avoids the use of sealants, adhesives or gaskets and the like, which may degrade over time and when subjected to harsh environments.

Metal construction also advantageously permits the use of vents in accordance with the present invention in high temperature applications, such as in lighting enclosures. It is advantageous that lighting equipment, particularly emergency lighting equipment, be listed by Underwriters Laboratories ("UL"). Molded plastic and other non metallic vents typically cannot meet UL standards for fire protection lighting. Furthermore, metal construction can be more cost effective for limited commercial production than polymer construction because of the cost and complexity of plastic injection and extrusion molding.

The Vent Body

In one aspect, the metal vent body includes an elongated root for insertion into the housing and a flared head for holding the membrane. An aperture extends through the vent body from root to head, providing fluid communication between the housing and the atmosphere.

The root of the vent body may be of any shape, but typically is cylindrical to match vent holes drilled or formed into a housing. The root may be tapered at its end to facilitate insertion or to permit the vent to be driven into the housing. Alternatively, threads may be cut or rolled into the outside of the root which cooperate with a tapped hole in the housing. A variety of other securing mechanisms may also be incorporated into the root to retain the vent. For example, a groove may be incorporated in the root to receive a snap ring to retain the vent. Alternatively, a locking ring could be pressed onto the root after insertion into the housing. Preferably, the root is threaded to match a tapped hole in the housing.

The head of the vent body includes a lower membrane bearing surface. The membrane bearing surface is typically round to match a cylindrical aperture, but may be of any shape and size to suit the application. Preferably, the membrane bearing surface surrounds the aperture. The shape of the head of the vent body is not critical; it may be cylindrical or of any other shape depending on the application. For example, the head may include a hexagonal part, so that a wrench can be used to drive a threaded vent into a tapped housing.

The aperture may be machined or formed into the vent body and may be straight, tapered or of any other configuration. For example, the aperture may be a tapered hole, which is narrow at the root and gradually increases in diameter in the direction of the top. Alternatively, the hole diameter may increase incrementally, with the diameter at the shaft typically being narrower than at the top. The larger area near the head permits a larger membrane to be used, which may improve venting in some applications.

The Shell

The shell is of all metal construction and is adapted to be secured to the vent body by an interference fit. In one aspect, the shell is cylindrical to match a similarly-shaped a vent body head. Preferably, the shell is adapted to protect the membrane from physical damage and liquid exposure and is perforated to allow a gas to pass through it.

The shell includes an upper membrane bearing surface. The upper membrane bearing surface cooperates with the lower membrane bearing surface on the vent body to compress the membrane. Compression of the membrane seals the aperture to prevent ingress of liquid and contaminants.

Preferably, the upper and lower membrane bearing surfaces are adapted to maximize compression of the membrane. To improve compression, the bearing surfaces may be configured to minimize contact area. For example, a ridge or other protrusion may be incorporated into the membrane bearing surface of the shell or the vent body to minimize membrane contact area and increase compressive force per unit area.

The choice of metallic materials for the vent body and shell are not critical and those of skill in the art will understand that material selection will vary with the application. Preferably, the vent is constructed of a stainless steel. For example, the stainless steel may be an alloy comprising nickel, chromium, vanadium, molybdenum or manganese and combinations thereof.

The Membrane

The membrane is porous. Preferably the membrane is formed from expanded polytetrafluoroethylene (ePTFE). Exemplary ePTFE materials may be prepared in accordance with the methods described in U.S. Pat. Nos. 3,953,566, 3,962,153; 4,096,227; 4,187,390; 4,902,423 or 4,478,665, which are hereby incorporated by reference. Porous ePTFE membranes may also be prepared by other methods. Porous ePTFE comprises a porous network of polymeric nodes and interconnecting fibrils and is commercially available in a wide variety of forms from W. L. Gore & Associates, Inc., Newark, Del.

As the term "ePTFE" is used herein, it is intended to include any PTFE material having a node and fibril structure, including in the range from a slightly expanded structure having fibrils extending from relatively large nodes of polymeric material, to an extremely expanded structure having fibrils that merely intersect with one another at nodal points. The fibrillar character of the structure is identified by microscopy. While the nodes may easily be identified for some structures, many extremely expanded structures consist almost exclusively of fibrils with nodes appearing only as the intersection point of fibrils. The resulting micropores or voids allow for good gas or air flow while providing water resistance.

The membrane may optionally include one or more fillers or coatings, also referred to as additives. For example, where the cover is an ePTFE membrane, additives may be included in the matrix of the ePTFE itself. Alternatively, the membrane may be imbibed with an additive/solvent mixture allowing good penetration of the additive into the porosity of the film. Imbibing is accomplished by first preparing an additive/solvent solution, and second, combining this solution with a porous film like expanded PTFE. The additive may also be coated onto one or more sides of the membrane. Desirable additives may include absorbents, adsorbents, surface energy modifiers; colorants, pigments, anti-microbials, antibacterial agents, antifungals; and mixtures thereof.

Optionally, the membrane may include a support layer, such as a woven or non woven fabric or a fiber scrim. The support layer may be laminated, bonded or only positioned adjacent to the membrane.

The thickness of the membrane is not critical, however, the membrane must be sufficiently thick to maintain a seal by an interference fit of the shell and vent body. Thin membranes require more precise machining and fitting of parts. Thicker membranes can be used, provided they are sufficiently permeable for effective venting. Preferably, the membrane is at least about 3 mils, or at least about 5 mils, 10 mils or 13 mils.

The shell is preferably secured to the vent body by an interference fit. As used herein, an "interference fit" is intended to encompass all manner of fitting parts in which the assembly is maintained by the aggregation of internal forces within the parts and friction between parts, without the use of adherents, such as adhesives, or welding, brazing and the like or caulking materials, compression gaskets, springs and the like.

Methods of securing the shell to the vent body by an interference fit may include, for example, the use of snap rings, press fitting, friction fitting or others. In one aspect, the shell may include tabs which project inward to cooperate with a groove or recess in the vent body. The tabs snap into place in the recess to lock the shell in place.

In another aspect, the present invention provides a one-piece, metal vent body. In this aspect, an aperture is provided through the one-piece vent body from the root to the head. The head includes a lower membrane bearing surface surrounding the aperture. The head also includes an upper membrane bearing surface surrounding the aperture. A membrane is disposed between the upper and lower membrane bearing surfaces and held in place by compression between membrane bearing surfaces. For example, the membrane may be placed between membrane bearing surfaces and the upper membrane bearing surface may be part of a lip or edge which is rolled or pressed to deform the vent body such that the membrane is held between the upper and lower membrane bearing surfaces.

Once assembled, vents in accordance with the present invention may be installed and sealed to a housing by any known means. Such means include, for example, flaring, swaging, coating the threads of the shaft with sealant, or providing an O-ring around the shaft. Where an O-ring is used, it is compressed between the lower surface of the vent body and the housing.

The vents in accordance with the present invention are best understood with reference to the accompanying figures, in which like numbers designate like parts.

Figure 2:
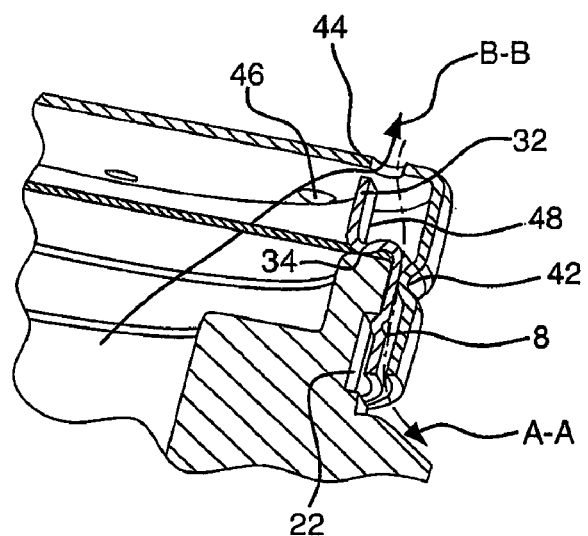
FIG. 2 is a detailed perspective view of a vent in accordance with the present invention shown in partial cut-away.
Figure 3:
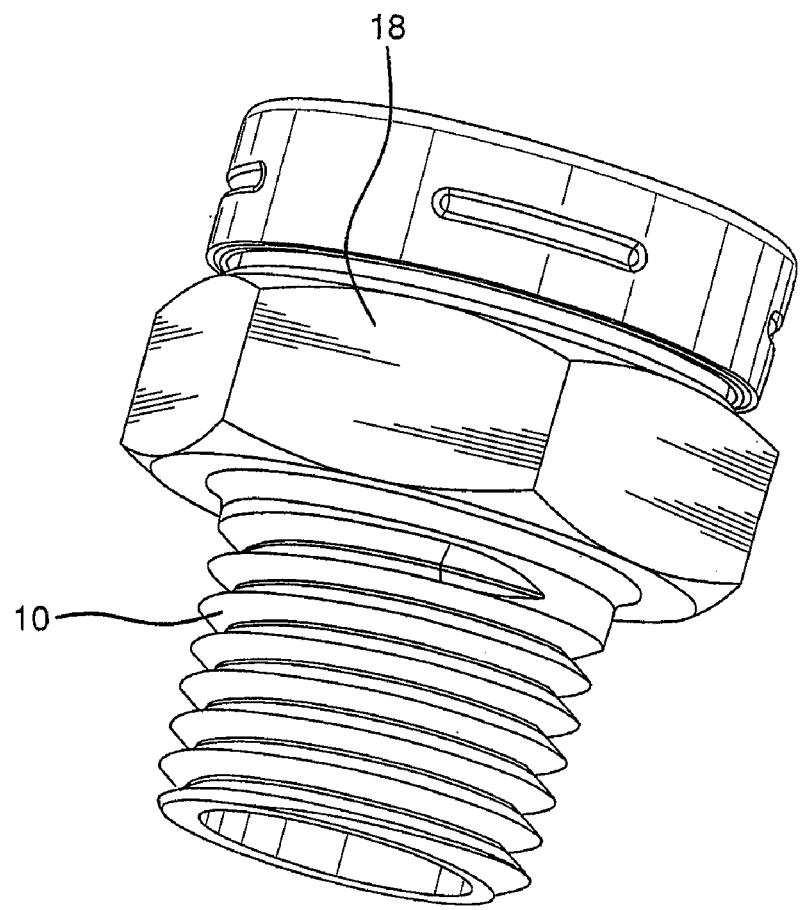
FIG. 3 shows another aspect of a vent in accordance with the present invention.

One aspect of the present invention is shown in FIGS. 1-3. The vent body 10 includes a root 12 having threads 14 and a head 16, which includes a hexagonal shaped portion 18. The hexagonal shaped portion permits using a wrench to drive the vent into a tapped housing. Threads may be National Pipe Thread (NPT) or straight threads. Where straight threads are used, a gasket 20 may be used to seal the vent to the housing. Groove 22 is cut into the head above the hexagonal portion. An aperture 24 extends through the vent body from root to head.

A shell 30 is secured to the vent body by an interference fit. A snap ring 38 on the shell cooperates with the groove 22 to secure the shell to the vent body. The shell also includes a baffle 32 extending toward the cap.

The cap 40 fits over the shell 30 and is held in place by cooperation of dimples 42 bearing on the shell. The cap includes perforations 44 at its outer perimeter. The perforations are positioned outside the baffle 32 such that liquids entering the perforations are prevented from contacting the membrane 50 by the baffle. Gaps between dimples provide a drainage path, labeled A-A, between the cap and the shell for liquid entering the perforations by 44. Dimples 46 in the top shell contact the upper edge of the baffle, maintaining a gap between the top shell and baffle to permit gas flow.

The membrane 50 is compressed at its perimeter between the upper membrane bearing surface 48 of the shell and the lower membrane bearing surface 34 of the vent body.

FIGS. 4-6 show another embodiment. The housing to be vented includes a wall 2 that has an opening or port 4 that receives an insert 60 having threads 62. The insert 60 has a hexagonal recess 64 adapted to receive an allen wrench type driver for installing the insert in the housing. Formed or machined into the insert is a passageway 66 for passing a fluid. A web 68 extends from the interior sides of the passageway. Surrounding the passageway is a groove 61 for receiving a gasket 63.

The vent includes a shell 70 and a vent body 80. The vent body includes an elongated root 82 having a raised snap ring 84 formed therein. The shell includes perforations 72 which permit the flow of gas through the top shell.

The shell fits over the vent body and is retained by an interference fit. An inward projecting snap ring 73 formed into the outer perimeter of the shell cooperates with the outer, bottom edge 86 of the vent body to hold the two pieces together. The membrane 50 is compressed at its perimeter between the upper membrane bearing surface 74 of the shell and the lower membrane bearing surface 88 of the vent body.

The root is pressed into the insert and the snap-ring cooperates with the web within the passageway to retain the vent. The gasket is compressed between the wall and the vent body to form a seal between the vent and the insert.

Figure 7:
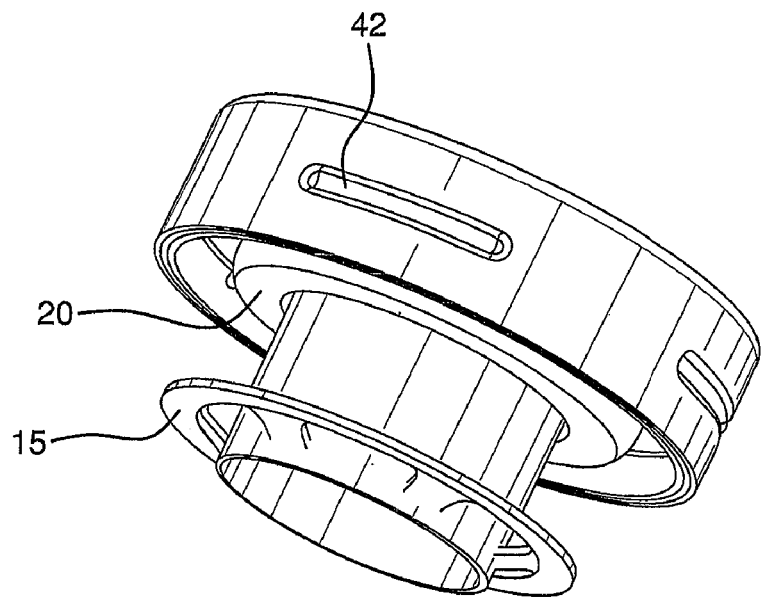
FIGS. 7-8 show another embodiment of a vent in accordance with the present invention in which the vent is adapted to be secured to a housing using a locking ring.
Figure 8:
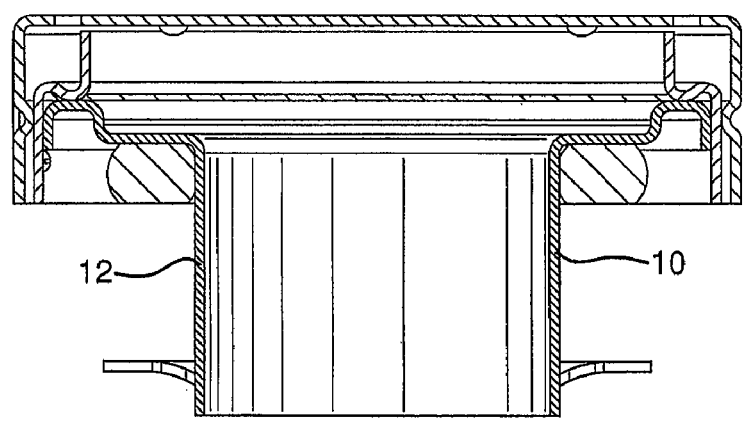
Figure 9:
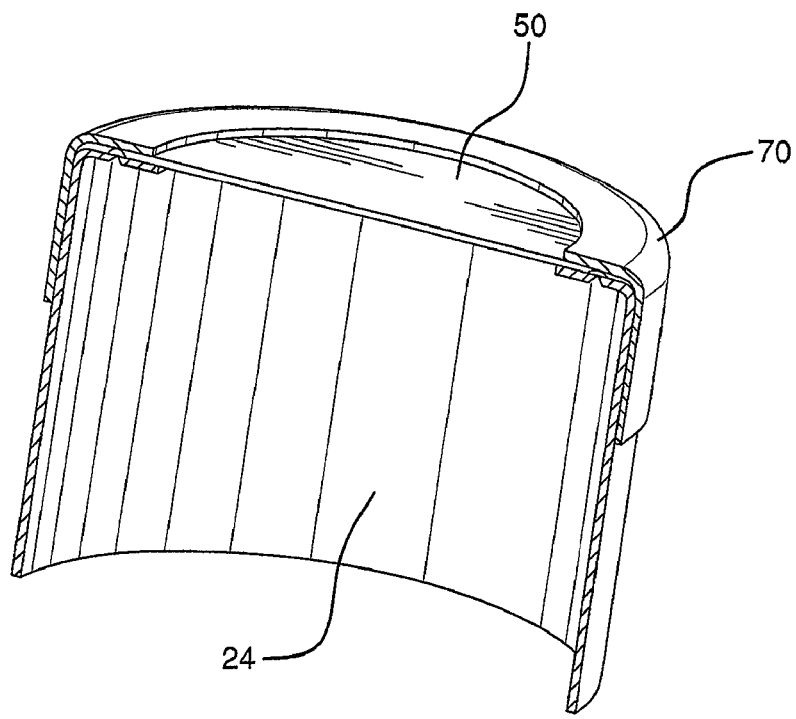
FIG. 9 shows another embodiment of a vent in accordance with the present invention in which the vent comprises only a membrane sealed between two metal parts.
Figure 10:
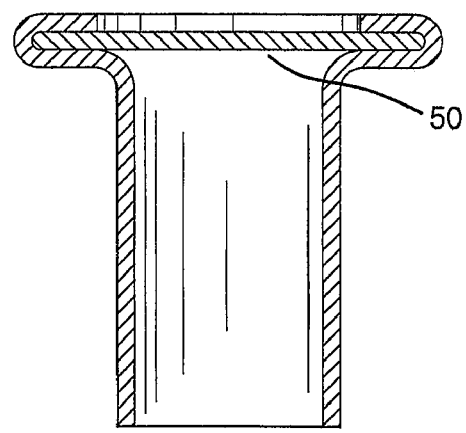
FIG. 10 shows another embodiment of a vent in accordance with the present invention in which the vent body comprises a single metal part.

Other embodiments are shown in FIGS. 7-10. In FIGS. 7-8, vent body 10 has a cylindrical root 12 for insertion into a housing. A locking ring 15 pressed onto the root after it is inserted into the housing holds the vent in place. Gasket 20 seals the vent to the housing. FIG. 9 shows a two piece construction. A top shell is pressed over a vent body having an aperture to seal the membrane over the aperture. FIG. 10 shows a one-piece vent body construction. The metal vent body includes both the upper membrane bearing surface and the lower membrane bearing surface.

Test Methods

Water Resistance—Suter Method

Membranes suitable for use in the present invention may be tested for water-resistance using a modified Suter test apparatus, which is a low water entry pressure challenge. Water is forced against the underside of a by two circular rubber gaskets in a leak-proof clamped arrangement. In deformable samples, the sample may be overlaid by a reinforcing scrim (e.g. an open non-woven fabric) clamped over the sample. The upper side of the sample is open to the atmosphere and visible to the operator. The water pressure on the underside of the sample is increased to 2 psi by a pump connected to a water reservoir, as indicated by a pressure gauge and regulated by an in-line valve. The upper side of the sample is visually observed for a period of three minutes for the appearance of any water which might be forced through the sample in the event of lack of water-resistance. Liquid water seen on the surface is interpreted as a deficiency in the water-resistance of the sample (i.e., a leak). The sample has passed the test if no liquid water is visible on the upper side of the sample within the three minute test period.

EXAMPLE 1

A vent body was machined from hexagonal stainless steel bar stock. The stock was cut to length and threads were cut into one end of the bar stock. A hole was drilled through the length of the bar stock to create an aperture. Starting from the end opposite from the thread, the hexagonal bar stock was rounded to create cylinder above a hexagonal driving portion. Next, a groove was cut in the cylinder near the top. Finally, the membrane bearing surface was prepared on the top of the cylinder section of the bolt by sanding with 600 grit sand paper to remove any burs and to provide some grip to the membrane bearing surface.

The shell was formed using a deep draw metal forming process to first form a cylindrical shell. A horizontal "S" shape bend, as seen in the figures, was created with inside rounds of about 0.01" to form the upper membrane bearing surface. Next, inward projecting dimples were placed in four evenly spaced locations around the outer wall. The dimples are located near the bottom edge. Finally, the shell was perforated by drilling a series of holes near the perimeter.

The components were assembled using a pneumatic press applying a force of 565 pounds. Pressure was maintained for 3 seconds after the components were snapped together.

As the shell and vent body are brought together, the dimples in the top shell snap into the groove cut into the cylindrical section of the vent body. This keeps the upper membrane bearing surface pressed against a first side of an approximately 8 mil ePTFE membrane, while the lower membrane bearing surface of the vent body opposes the pressure. The compression of the microporous ePTFE membrane disk between the membrane bearing surfaces seals the aperture.

EXAMPLE TWO

A shell was formed of 304 stainless steel using a deep draw metal forming process. As described above, an "S" shaped bend was created in the shell to form the upper membrane bearing surface. Dimples were placed in four evenly spaced locations around the outer wall of the shell near the bottom edge. Perforations were provided above the "S" shaped bend.

The vent body was also formed using a deep draw metal forming process and 304 stainless steel. A tube was flared to form a flange on one end. An inverted "U" shape having a bend radius of 0.010" was formed such that the "U" shape was on outside edge of the flange. The inverted "U" shape provides the lower membrane bearing surface.

The components were assembled with a press applying a force of 565 pounds. This pressure is maintained for 3 seconds after the components are snapped together.

As the shell and vent body are brought together, the dimples in the shell snap over the outside edge of the "U" shape on the vent body. The upper membrane bearing surface in the shell is compressed against the lower membrane bearing surface on the vent body. The microporous membrane disk of Example 1 is compressed between bearing surfaces to form a seal surrounding the aperture.

To attach the vent to a housing, a silicone O-ring is placed on to the root of the vent body. A hole is drilled into the housing slightly larger than the outside diameter of the shaft on the vent body. The root on the vent body is inserted into the hole on the housing. A self-locking ring, such as a "Rotor Clip TY-37" may be pushed onto the shaft so that the O-ring is compressed between the housing and the vent body.

EXAMPLE THREE

A 304 stainless steel shell was formed in the shape of an inverted cup using a deep draw metal process. A hole was cut from the center of the shell.

A vent body was formed of the same material in the shape of an inverted cup. A lower membrane bearing surface was formed by an outwardly projecting rib in the top surface of the bottom cup near the outer perimeter of the vent body. A hole is cut in the bottom of the cup to form an aperture.

The components were assembled using a hydraulic press applying a force of 70 pounds. A microporous membrane disc of Example 1 was placed inside the top cup. Friction between the inner wall of the top shell and the outer wall of the vent body provides an interference fit. Compression of the microporous membrane disc between the top shell and the rib in the vent body creates a seal surrounding the aperture.

While particular embodiments of the present invention have been illustrated and described herein, the present invention should not be limited to such illustrations and descriptions. It should be apparent that changes and modifications may be incorporated and embodied as part of the present invention within the scope of the following claims.

The invention claimed is:

1. A vent for a housing, the housing defining an interior space and an exterior space, the vent comprising:
   a) a metal body comprising an aperture for the passage of a fluid between the interior space and the exterior space defined by said housing and a first metallic membrane bearing surface surrounding the aperture and
   b) a porous polymeric membrane having a first side in contact with the first metallic membrane bearing surface and
   c) a metal shell having a second metallic membrane bearing surface, said shell being attached to the body by an interference fit, wherein compression of the membrane, between the first metallic membrane bearing surface and the second metallic membrane bearing surface forms a moisture proof seal.

2. The vent of claim 1, further comprising a cap for protecting the membrane.

3. The vent of claim 2, wherein the cap further comprises at least one perforation for the passage of a fluid.

4. The vent of claim 1, wherein the membrane is gas permeable and liquid resistant.

5. The vent of claim 1, wherein the porous polymeric membrane comprises ePTFE.

6. The vent of claim 5, in which the porous polymeric membrane comprises ePTFE and at least one support layer.

7. The vent of claim 5, wherein the membrane comprises ePTFE and a filler.

8. The vent of claim 7, wherein the filler is selected from the group consisting of absorbents, adsorbents, surface energy modifiers; colorants, pigments, anti-microbials, anti-bacterial agents, anti-fungals and mixtures thereof.

9. The vent of claim 5, wherein the membrane further comprises a coating.

10. The vent of claim 9, wherein the coating is selected from the group consisting of absorbents, adsorbents, surface energy modifiers; colorants, pigments, anti-microbials, anti-bacterial agents, anti-fungals and mixtures thereof.

11. The vent of claim 1, wherein the membrane has a thickness of less than about 13 mils.

12. The vent of claim 1, wherein the membrane has a thickness of less than about 10 mils.

13. The vent of claim 1, wherein the membrane has a thickness of less than about 5 mils.

14. The vent of claim 1, wherein the membrane has a thickness of less than about 3 mils.

15. The vent of claim 1, wherein the seal is a hermetic seal.

16. The vent of claim 1, wherein the vent body comprises stainless steel.

17. A vent for a housing, the housing defining an interior space and an exterior space, the vent consisting essentially of:

a) a metal body having an aperture for the passage of a fluid between the interior space and the exterior space defined by said housing and a membrane bearing surface surrounding the aperture;
b) a porous polymeric membrane covering the aperture and having a first side in contact with the first membrane bearing surface and a second side opposite the first side;
c) a metal shell having a second membrane bearing surface, the second membrane bearing surface in contact with the second side of the membrane and said shell attached to said body by an interference fit to form a moisture proof seal surrounding the aperture.

18. The vent of claim 17, further comprising a cap for protecting the membrane.

19. The vent of claim 18, wherein the cap further comprises at least one perforation for the passage of a fluid.

20. The vent of claim 17, wherein the membrane comprises ePTFE.

21. The vent of claim 20, in which the membrane comprises ePTFE and at least one support layer.

22. The vent of claim 20, wherein the membrane comprises ePTFE and a filler.

23. The vent of claim 22, wherein the filler is selected from the group consisting of absorbents, adsorbents, colorants, surface energy modifiers; pigments, anti-microbials, anti-bacterial agents, anti-fungals and mixtures thereof.

24. The vent of claim 20, wherein the membrane further comprises a coating.

25. The vent of claim 24, wherein the coating is selected from the group consisting of absorbents, adsorbents, surface energy modifiers; colorants, pigments, anti-microbials, anti-bacterial agents, anti-fungals and mixtures thereof.

26. The vent of claim 17, wherein the membrane is gas permeable and liquid resistant.

27. The vent of claim 17, wherein the membrane has a thickness of less than about 13 mils.

28. The vent of claim 17, wherein the membrane has a thickness of less than about 10 mils.

29. The vent of claim 17, wherein the membrane has a thickness of less than about 5 mils.

30. The vent of claim 17, wherein the membrane has a thickness of less than about 3 mils.

31. The vent of claim 17, wherein the seal is a hermetic seal.

32. The vent of claim 17, wherein the shell further comprises a baffle disposed between the at least one perforation and the membrane for preventing liquid from contacting the membrane.

33. The vent of claim 17, wherein the body and shell comprise stainless steel.

34. A device, comprising:
a) a housing for enclosing equipment or chemicals;
b) a port in the housing;
c) a vent disposed over the port, the vent consisting essentially of a metal body having an aperture for passage of a gas;
d) a porous membrane spanning the aperture; and
e) a metal cap having a perforation therein for the passage of a gas, the cap attached to the body by an interference fit,
whereby compression of the membrane between the metal body and the metal cap forms a seal between the membrane and the body.

35. The method of making a vent for a housing, the housing defining an interior space and an exterior space, the vent comprising:
a) providing a metal body including an aperture therethrough for the passage of a gas between the interior space and the exterior space defined by said housing,
b) covering the aperture with a porous polymeric membrane such that the membrane contacts the metal body,
c) attaching a metal cover having a perforation therein to the metal body by an interference fit whereby the cover compresses the porous polymeric membrane between the metal cover and the metal body, whereby a moisture proof seal surrounding the aperture is formed.

* * * * *